United States Patent
Gangopadhyay et al.

(10) Patent No.: US 12,500,080 B2
(45) Date of Patent: *Dec. 16, 2025

(54) SYSTEMS AND METHODS FOR DEPOSITING LOW-K DIELECTRIC FILMS

(71) Applicant: Applied Materials, Inc., Santa Clara, CA (US)

(72) Inventors: Shruba Gangopadhyay, San Jose, CA (US); Bhaskar Jyoti Bhuyan, San Jose, CA (US); Michael Haverty, Mountain View, CA (US); Bo Xie, Sunnyvale, CA (US); Li-Qun Xia, Cupertino, CA (US); Rui Lu, Santa Clara, CA (US); Yijun Liu, Sunnyvale, CA (US); Ruitong Xiong, San Jose, CA (US); Xiaobo Li, San Jose, CA (US); Lakmal C. Kalutarage, San Jose, CA (US); Lauren Bagby, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 630 days.

This patent is subject to a terminal disclaimer.

(21) Appl. No.: 17/896,734

(22) Filed: Aug. 26, 2022

(65) Prior Publication Data

US 2024/0087880 A1    Mar. 14, 2024

(51) Int. Cl.
*H01L 21/02*  (2006.01)
*H01J 37/32*  (2006.01)

(52) U.S. Cl.
CPC .. *H01L 21/02126* (2013.01); *H01J 37/32724* (2013.01); *H01L 21/02208* (2013.01); *H01L 21/02274* (2013.01); *H01J 37/32357* (2013.01)

(58) Field of Classification Search
CPC ........... H01L 21/76832; H01L 21/0228; H01L 21/76831
See application file for complete search history.

(56) References Cited

U.S. PATENT DOCUMENTS 6,331,494 B1 * 12/2001 Olson ................ C23C 16/401
                                                    438/770
11,600,486 B2 * 3/2023 Xie ................... H01L 21/02164
(Continued)

FOREIGN PATENT DOCUMENTS

CN   1754252 A    3/2006
WO   03060979 A2  7/2003

OTHER PUBLICATIONS ip.com search results. (Year: 2025).*
Application No. PCT/US2023/071661, International Search Report and the Written Opinion, Mailed on Nov. 22, 2023, 11 pages.

*Primary Examiner* — Zandra V Smith
*Assistant Examiner* — Andre C Stevenson
(74) *Attorney, Agent, or Firm* — Kilpatrick Townsend & Stockton LLP

(57) ABSTRACT

Embodiments include semiconductor processing methods to form low-κ films on semiconductor substrates are described. The processing methods may include flowing one or more deposition precursors to a semiconductor processing system. The one or more deposition precursors may include a silicon-containing precursor that may be a cyclic compound. The methods may include generating a deposition plasma from the one or more deposition precursors. The methods may include depositing a silicon-and-carbon-containing material on the substrate from plasma effluents of the deposition plasma. The silicon-and-carbon-containing material as-deposited may be characterized by a dielectric constant less than or about 3.0.

20 Claims, 3 Drawing Sheets

(56) References Cited

U.S. PATENT DOCUMENTS

| | | |
|---|---|---|
| 11,621,162 B2 * | 4/2023 | Xie .................. H01L 21/02211 |
| | | 438/778 |
| 2004/0043197 A1 | 3/2004 | Matsuura |
| 2004/0166692 A1 | 8/2004 | Loboda et al. |
| 2005/0042884 A1 | 2/2005 | Hyodo et al. |
| 2015/0380302 A1 * | 12/2015 | Mountsier ......... H01L 21/76814 |
| | | 438/654 |
| 2020/0247830 A1 * | 8/2020 | Lei .......................... C07F 7/025 |
| 2021/0181637 A1 | 6/2021 | Kori et al. |

* cited by examiner

SYSTEMS AND METHODS FOR DEPOSITING LOW-K DIELECTRIC FILMS

TECHNICAL FIELD

The present technology relates to deposition processes and chambers. More specifically, the present technology relates to methods of producing low-κ films that may not utilize UV treatments.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the films are removed relative to one another. Plasma-enhanced deposition may produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

Embodiments of the present technology encompass semiconductor processing methods to form low-κ films on semiconductor substrates are described. The processing methods may include flowing one or more deposition precursors to a semiconductor processing system. The one or more deposition precursors may include a silicon-containing precursor that may be a cyclic compound. The methods may include generating a deposition plasma from the one or more deposition precursors. The methods may include depositing a silicon-and-carbon-containing material on the substrate from plasma effluents of the deposition plasma. The silicon-and-carbon-containing material as-deposited may be characterized by a dielectric constant less than or about 3.0.

In some embodiments, the silicon-containing precursor is characterized by Formula 1:

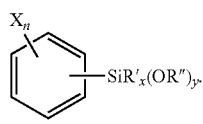

R' may be a $C_1$-$C_6$ alkyl group, a $C_1$-$C_6$ allyl group, or hydrogen, where x may be between 0 and 3. R" may be a $C_1$-$C_6$ alkyl group, where y may be between 0 and 3. X may be a $C_1$-$C_6$ alkyl group, a $C_1$-$C_6$ allyl group, $NO_2$, $NH_2$, OR', or hydrogen, where n may be between 0 and 4. The silicon-containing precursor may include a benzene ring, a cyclopentane ring, or a cyclohexane ring. The deposition precursors may further include molecular oxygen ($O_2$), diatomic hydrogen ($H_2$), or a combination of both. Generating the deposition plasma from the one or more deposition precursors may include forming the deposition plasma in a remote plasma unit. The silicon-and-carbon-containing material may be characterized by a methyl incorporation greater than or about 2.0 at. %. The silicon-and-carbon-containing material may be characterized by a Young's modulus of greater than or about 3 GPa. The silicon-and-carbon-containing material may be characterized by a hardness of greater than or about 0.5 GPa.

Some embodiments of the present technology encompass semiconductor processing methods. The methods may include flowing deposition precursors to a semiconductor processing system. The deposition precursors may include a silicon-containing precursor and a carbon-containing precursor. The carbon-containing precursor may be a cyclic compound. The methods may include generating a deposition plasma from the one or more deposition precursors. The methods may include depositing a silicon-and-carbon-containing material on a substrate from plasma effluents of the deposition plasma. The silicon-and-carbon-containing material as-deposited may be characterized by a dielectric constant less than or about 3.0.

In some embodiments, a temperature may be maintained at less than or about 420° C. during the generation of the deposition plasma. The deposition precursors may further include molecular oxygen ($O_2$). The deposition precursors may further include diatomic hydrogen ($H_2$). Generating the deposition plasma from the one or more deposition precursors may include forming the deposition plasma in a remote plasma unit. The silicon-and-carbon-containing material as-deposited may be characterized by a Young's modulus of greater than or about 5 GPa.

Some embodiments of the present technology encompass semiconductor processing methods. The methods may include flowing deposition precursors into a substrate processing region of a semiconductor processing chamber. The deposition precursors may include a silicon-containing precursor. The deposition precursors comprise a cyclic compound. The methods may include generating a deposition plasma from the deposition precursors within the substrate processing region. The methods may include depositing a silicon-and-carbon-containing material on the substrate from plasma effluents of the deposition plasma. The silicon-and-carbon-containing material as-deposited may be characterized by a dielectric constant less than or about 3.0. The silicon-and-carbon-containing material as-deposited may be characterized by a Young's modulus of greater than or about 4.0 GPa.

In some embodiments, the silicon-containing precursor may include the cyclic compound of the deposition precursors. The deposition precursors may further include at least one carrier gas including helium or nitrogen ($N_2$). Generating the deposition plasma may include applying a RF power of less than or about 500 W. A flow rate of the deposition precursors may be characterized by less than or about 500 mg/min. The methods may include performing a post-deposition treatment to the silicon-and-carbon-containing material. The post-deposition treatment may include a UV cure or a thermal anneal.

Such technology may provide numerous benefits over conventional processing methods. For example, utilizing deposition precursors that include cyclic compounds may increase the presence of closed nanopores within the as-deposited low-κ material. This increase in the amount of closed nanopores may permit increased levels of carbon in the material without reducing its mechanical properties such as Young's modulus and hardness. The cyclic compounds, in addition to forming closed nanopores, may increase levels of carbon in these low-κ films, decreasing the dielectric constant (κ value) of the films to less than or about 3.0 without a concurrent decrease in their mechanical stability. Further, the increased presence of closed nanopores may prevent or reduce etchants, such as wet etchants, from passing through open pores in the material to other layers or areas of the structure to cause damage. Embodiments of the present technology also include processing methods where depositions of the low-κ material may be conducted at temperatures greater than or about 420° C. The increased deposition temperatures also increase the amount of Si—C crosslinking in the low-κ material. In still further embodiments of the present technology, the as-deposited low-κ material may be characterized by low κ values and high mechanical stability without undergoing a post-deposition, ultraviolet treatment that adds additional time and complexity to the processing method. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
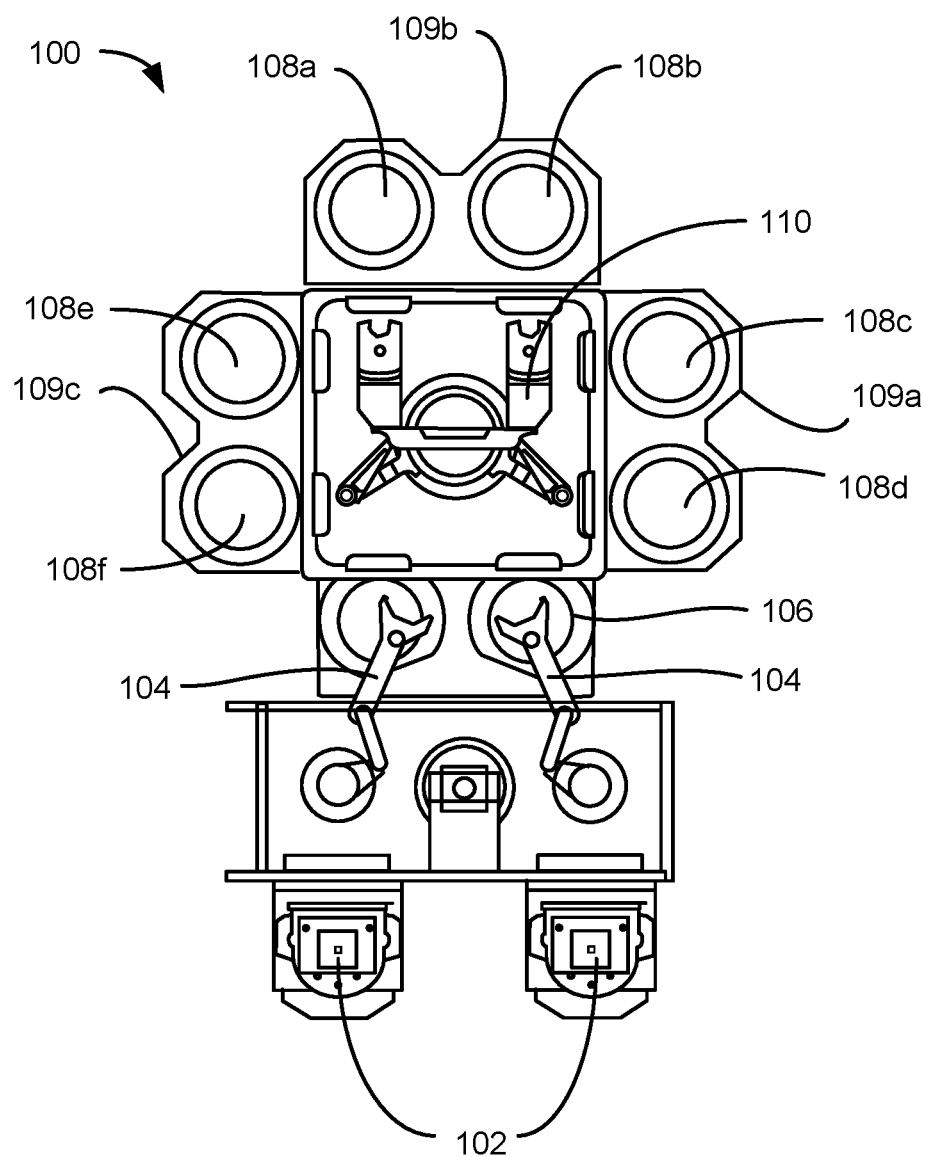
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During back-end-of-line (BEOL) semiconductor processing, low-κ films may serve multiple functions in the fabrication of metallization layers in an integrated circuit. These functions may include the incorporation of electrically-insulating low-κ films between electrically-conductive metal-containing structures such as interconnect lines, contact holes, and vias, among other structures. They may also include the partial removal of a low-κ film following the formation of metal structure. One common removal process in BEOL processing is chemical-mechanical-polishing (CMP) that uses a combination of chemical etching and physical abrasion to remove the low-κ material from a substrate surface.

Low-κ films used in BEOL processing should have a low dielectric constant (κ value) relative to undoped silicon oxide and high mechanical stability to resist fracturing during the formation of metal-containing structures and removal by CMP. Unfortunately, these qualities are often in tension in low-κ films made from a silicon-and-carbon-containing material. In many instances, a higher amount of carbon in the material may both lower the κ value and reduce the film's mechanical stability, as characterized by a lower Young's modulus and a lower hardness, among the film's other mechanical characteristics.

One approach to improving the mechanical stability of low-κ films is to treat the as-deposited film with ultraviolet light (i.e., a UV treatment/cure operation). Unfortunately, these UV treatment operations often involve transporting substrate from the low-κ film deposition chamber to a UV treatment chamber, which adds time and complexity to the overall low-κ film formation operation. In most instances, the UV light can only penetrate the low-κ material to a depth of a few angstroms, so a fully-treated low-κ film requires the shuttling of the substrate between the deposition and treatment chambers several times to complete the low-κ film that is tens to hundreds of angstroms thick. The multiple deposition-and-treatment operations can greatly reduce wafer throughput in a semiconductor fabrication process.

The present technology may overcome these issues by including embodiments of semiconductor processing methods that form low-κ films with good mechanical stability. In embodiments, these low-κ films may be characterized by a high Young's modulus (e.g., greater than or about 5.0 GPa) and a high hardness (e.g., greater than or about 0.2 GPa). By performing deposition at higher temperature with particular deposition precursors including one or more cyclic compounds, the films may be characterized by increased levels of closed nanopores within the films. This may overcome the natural tendency of the modulus, hardness, and other characteristic of the film's mechanical stability to fall as the dielectric constant decreases, while also reducing the number of operations required during processing. In particular, the present technology may not utilize subsequent processing after deposition, including UV exposure, plasma treatment, or other processing operations to post-treat the film to improve hardness.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may be used to perform deposition processes according to embodiments of the present technology before additional details according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
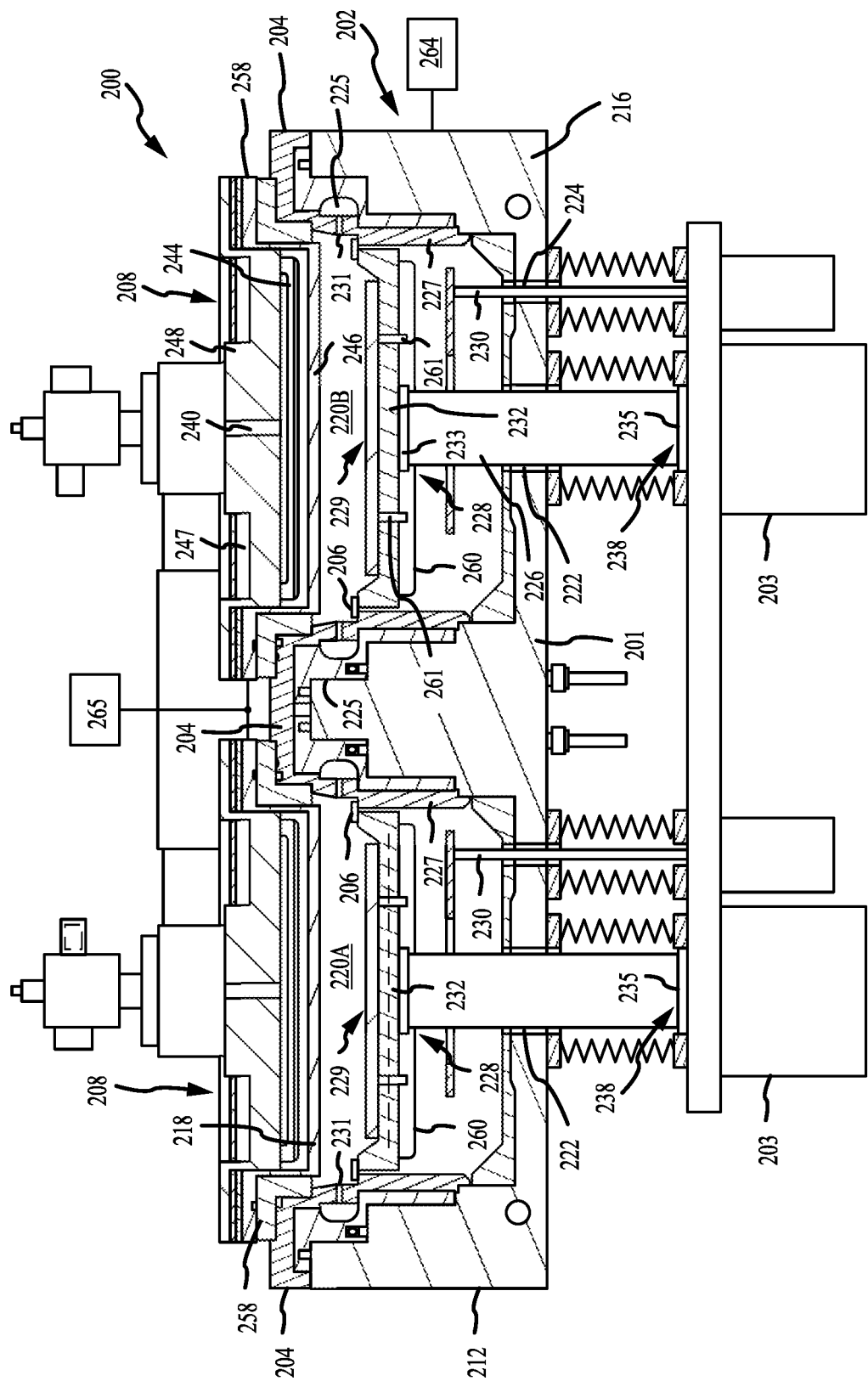
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. The dual-channel showerhead 218 and/or faceplate 246 may include one or more openings to permit the flow of precursors from the precursor distribution system 208 to the processing regions 220A and/or 220B. In some embodiments, the openings may include at least one of straight-shaped openings and conical-shaped openings. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
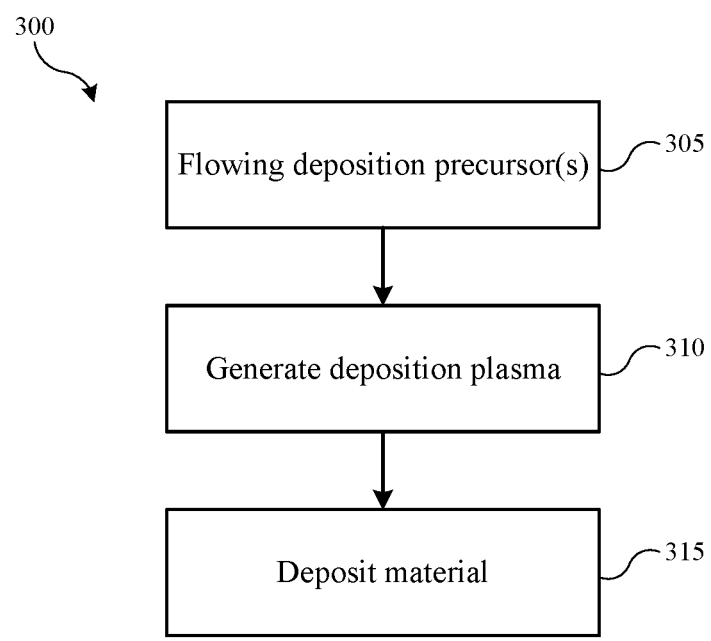
FIG. 3 shows operations of an exemplary method of semiconductor processing according to some embodiments of the present technology.

FIG. 3 shows operations of an exemplary method 300 of semiconductor processing according to some embodiments of the present technology. The method may be performed in a variety of processing chambers, including processing system 200 described above, as well as any other chamber in which plasma deposition may be performed. Method 300 may include a number of optional operations, which may or may not be specifically associated with some embodiments of methods according to the present technology.

Method 300 may include plasma-enhanced chemical-vapor-deposition (PECVD) processing operations to form as-deposited, low-κ films with high mechanical stability. In contrast to conventional methods, these as-deposited, low-κ films do not require post-deposition treatments like UV curing to increase the mechanical stability of the films. While post-deposition treatments may not be required, said treatments may still be performed in some embodiments to further increase various properties of the films. In some embodiments, the method may include optional operations prior to initiation of method 300, or the method may include additional operations after the deposition of the low-κ, mechanically stable material. In additional embodiments, method 300, as shown in FIG. 3, may include flowing deposition precursors into a substrate processing region of a semiconductor processing chamber at operation 305. In embodiments, a substrate may be present in the substrate processing region of the semiconductor processing chamber as the deposition precursors flow into the chamber.

The deposition precursors may include a cyclic compound. By providing one or more deposition precursors having a cyclic compound, closed nanopores may form within the film, lowering the dielectric constant and increasing mechanical properties of the film. In embodiments, the deposition precursors may include a silicon-containing precursor. In embodiments, the deposition precursors may include a silicon-containing precursor. The silicon-containing precursor may be a cyclic compound. In additional embodiments, the silicon-containing precursor may be characterized by Formula 1:

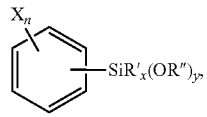

where R' may be a $C_1$-$C_6$ alkyl group, a $C_1$-$C_6$ allyl group, or hydrogen. In Formula 1, x may be between 0 and 3. R" may be a $C_1$-$C_6$ alkyl group, and y may be between 0 and 3. X may be a $C_1$-$C_6$ alkyl group, a $C_1$-$C_6$ allyl group, $NO_2$, $NH_2$, OR', or hydrogen, and n may be between 0 and 4. In further embodiments, the silicon-containing precursor may be the following silicon-containing cyclic compounds, which can be represented by the structure formulas:

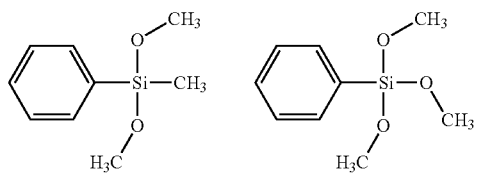

In further embodiments, the silicon-containing precursor may include precursors having Si—O bonds and/or Si—C bonds, and may include linear branched silicon-containing precursors, cyclic silicon-containing precursors, or any number of additional silicon-containing precursors. For example, the silicon-containing precursor may be characterized by Formula 2:

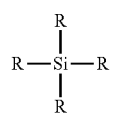

where each R may be independently selected from an alkyl group (e.g., a $C_1$-$C_6$ alkyl group), an alkoxy group, an alkene group, an alkyne group, an acrylate, a halide, $NO_2$, $NH_2$, CN, NCO, NCS, or C=OR.

Additional embodiments of the silicon-containing precursor may include those having Formula 3:

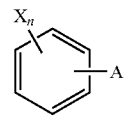

where A shares the same features as SiR'$_x$(OR")$_y$ as previously discussed with regard to Formula 1. The precursor may have one, two, three, or more A constituents extending from carbons of the ring. X may be a $C_1$-$C_6$ alkyl group, a $C_1$-$C_6$ allyl group, $NO_2$, $NH_2$, OR', or hydrogen, and n may be between 0 and 4. In further embodiments, the silicon-containing precursor may be the following silicon-containing cyclic compound, which can be represented by the structure formula:

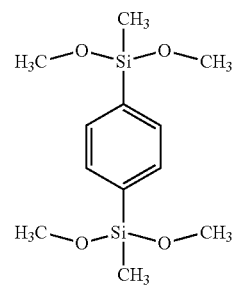

In some embodiments, the deposition precursors may further include molecular oxygen ($O_2$). In embodiments, the flow rate of the $O_2$ relative to the flow rate of the silicon-containing precursor may be maintained at a flow rate ratio that assists in forming an as-deposited low-κ film with both a low dielectric constant (κ value) and high mechanical stability as reflected in film characteristics such as Young's modulus and hardness, among others. Additionally or alternatively, the deposition precursors may also include hydrogen, such as diatomic hydrogen ($H_2$).

In still further embodiments, the deposition precursors may include a carbon-containing precursor. In embodiments, the carbon-containing precursor may be a cyclic compound. For example, the carbon-containing precursor may be a cyclic hydrocarbon compound or may be a cyclic compound including oxygen. It is contemplated that the carbon-containing precursor may provide the cyclic compound, and the silicon-containing precursor may or may not include a cyclic compound. Accordingly, the silicon-containing precursor may be a conventional silicon compound for depositing silicon-containing material when a cyclic carbon-containing compound is provided. In such embodiments, the carbon-containing precursor may be, for example, benzene, cyclopentane, cyclohexane, pyridine, furan, or any other cyclic carbon-containing compound.

In further embodiments, the deposition precursors may also include one or more carrier gases such as helium (He), nitrogen ($N_2$), and argon (Ar). Although the one or more carrier gases may be delivered with other deposition precursors, the carrier gases may be considered inert gases that do not react to form part of the as-deposited low-κ film.

In embodiments, a flow rate for the silicon-containing precursor may be greater than or about 100 milligrams-per-minute (mgm), greater than or about 110 mgm, greater than or about 120 mgm, greater than or about 130 mgm, greater than or about 140 mgm, greater than or about 150 mgm, greater than or about 160 mgm, greater than or about 170 mgm, greater than or about 180 mgm, greater than or about 190 mgm, greater than or about 200 mgm, greater than or about 210 mgm, greater than or about 220 mgm, greater than or about 230 mgm, greater than or about 240 mgm, greater than or about 250 mgm, or more. A flow rate for the one or more carrier gases may be greater than or about 300 sccm, greater than or about 320 sccm, greater than or about 340 sccm, greater than or about 360 sccm, greater than or about 380 sccm, greater than or about 400 sccm, greater than or about 420 sccm, greater than or about 440 sccm, greater than or about 460 sccm, greater than or about 480 sccm, greater than or about 500 sccm, or more.

In some embodiments, there has been observed that an excessive flow rate of $O_2$ relative to the silicon-containing precursor may increase the dielectric constant of the as-deposited low-κ film to an unusually large extent. It is believed that the excessive $O_2$ flow rate in these instances may cause an increased number of reactions between the oxygen and hydrogen in the film to create hydroxyl (—OH) groups. In many embodiments, the dielectric constant of a silicon-oxygen-and-carbon-containing low-κ film may be highly sensitive to the amount of hydroxyl groups in the film. A relatively small increase in the amount of hydroxyl groups in the film (e.g., an increase less than or about 1 at. %) may cause a relatively large increase in the film's dielectric constant (e.g., an increase greater than or about 10%). In some embodiments, the $O_2$ flow rate may be less than or about 200 sccm, less than or about 180 sccm, less than or about 160 sccm, less than or about 150 sccm, or less.

In additional embodiments, the deposition precursors that flow into the substrate processing region of the semiconductor processing chamber may alter the pressure in the chamber. In embodiments, the semiconductor substrate chamber pressure may be characterized by a pressure greater than or about 1 Torr, greater than or about 2 Torr, greater than or about 3 Torr, greater than or about 4 Torr, greater than or about 5 Torr, greater than or about 6 Torr, greater than or about 7 Torr, greater than or about 8 Torr, greater than or about 9 Torr, greater than or about 10 Torr, or more during the formation of a low-κ film. Similarly, the pressure may be characterized by a pressure less than or about 10 Torr, less than or about 9 Torr, less than or about 8 Torr, less than or about 7 Torr, less than or about 6 Torr, less than or about 5 Torr, or less.

Embodiments of method 300 may include generating a deposition plasma from the deposition precursors at operation 310. In embodiments, the deposition plasma may be generated from the deposition precursors within the processing region, such as by providing RF power to the faceplate to generate a plasma within the substrate processing region of the semiconductor processing chamber. The deposition plasma may alternatively be formed remote from the substrate processing region, such as in a remote plasma system. By forming a remote plasma, the a Si—O—Si network may be maintained in the deposited film. The deposition plasma may be generated at any of the frequencies previously described, and may be generated at a frequency less than 15 MHz (e.g., 13.56 MHz). Although higher frequency may be used, in some embodiments the lower frequency plasma generation may facilitate removal of carbon during processing, unlike higher plasma frequency operations. Further, the plasma may be formed using an RF power of less than or about 1,000 W, and may be formed at less than or about 900 W, less than or about 800 W, less than or about 700 W, less than or about 600 W, less than or about 500 W, less than or about 400 W, less than or about 300 W, less than or about 250 W, less than or about 200 W, less than or about 150 W, less than or about 100 W, or less.

Embodiments of method 300 may include depositing the low-κ film on a substrate at operation 315. In embodiments, the substrate is present in the substrate processing region of the semiconductor processing chamber, and the low-κ film is formed from deposition plasma effluents generated by the deposition plasma also present in the processing region. In some embodiments, the substrate may be characterized by a temperature less than or about 420° C., less than or about 410° C., less than or about 410° C., less than or about ° C., less than or about 380° C., less than or about 370° C., less than or about 360° C., less than or about 350° C., less than or about 340° C., less than or about 330° C., less than or about 320° C., less than or about 310° C., less than or about 300° C., less than or about 290° C., less than or about 280° C., less than or about 270° C., or less during the deposition. In embodiments, the temperature of the substrate may be set to increase the amount of Si—C crosslinking in the as-deposited low-κ film. Increased Si—C crosslinking can increase the mechanical stability of the low-κ film. In embodiments, the as-deposited low-κ film may be characterized by an increased Young's modulus and an increased hardness at the higher temperatures. On the other hand, excessively high temperatures may cause the carbon in the depositing low-κ film to volatilize and outgas from the film. At excessively high temperatures, significant amounts of carbon may be removed from the low-κ film as carbon oxides (e.g., CO, $CO_2$) and volatile organic compounds (e.g., —$CH_3$, $CH_4$) to lower the carbon level in the film. The decreased carbon levels may increase the dielectric constant (κ value) of the film to levels greater than 3.0, greater than or about 3.1, greater than or about 3.2, greater than or about 3.3, greater than or about 3.4, greater than or about 3.5, or more. In some embodiments, the substrate may be characterized by a temperature of less than or about 450° C. during the deposition of the low-κ film.

In some embodiments, the deposition rate for the low-κ film may exceed 10 Å/min, and may be deposited at a rate greater than or about 15 Å/min, greater than or about 20 Å/min, greater than or about 50 Å/min, greater than or about 100 Å/min, greater than or about 150 Å/min, greater than or about 200 Å/min, greater than or about 250 Å/min, greater than or about 300 Å/min, greater than or about 400 Å/min, greater than or about 500 Å/min, or more. After deposition to a sufficient thickness (e.g., less than or about 1000 Å), many conventional processes may then transfer the substrate to a second chamber to perform a treatment, such as a UV treatment or other post-deposition treatment. This may reduce throughput, and may increase production costs by requiring an additional chamber or tool to perform the treatment. The present technology, however, may produce materials, including silicon-and-carbon-containing material (e.g., carbon-doped silicon oxide), which may be characterized by sufficient material properties as-deposited, and without additional treatments, such as a UV treatment. Although embodiments of the present technology may encompass additional treatments subsequent deposition, the as-deposited characteristics of the film may include a range of improvements over conventional technology.

As explained above, the processing methods of the present technology may include embodiments that utilize deposition precursors and processing conditions that form low-κ films having a low dielectric constant and high mechanical stability. In embodiments of processing method 300, as-deposited low-κ films may be formed as silicon-carbon-and-oxygen-containing films with dielectric constants less than or about 3.0, less than or about 2.9, less than or about 2.8, less than or about 2.7, less than or about 2.6, less than or about 2.5, less than or about 2.4, less than or about 2.3, less than or about 2.2, less than or about 2.1, less than or about 2.0, or less. The low dielectric constant of the films may be at least partly attributed to the porosity of the films. In embodiments, the use of precursors containing a cyclic compound enable the formation of closed nanopores within the films. The formation of closed nanopores reduces the dielectric constant of the films, while maintaining mechanical stability. In conventional film formation, the previously stated dielectric constants may only be possible with high porous atomic scale networks, typically requiring poragen and/or spin-on application methods.

In some embodiments, the decreased dielectric constant (κ value) and increased mechanical stability of the low-κ film may be correlated with an increased level of methyl groups as part of the overall carbon in the film. The retention of methyl groups in the low-κ film may maintain higher atomic percentages of carbon in the material, which in turn may reduce the dielectric constant of the material. However, it is thought that the methyl groups have less of a destabilizing effect on the mechanical properties of the low-κ film than other hydrocarbon groups. In embodiments, the increased level of methyl groups may be partly attributed to deposition precursors that include at least one cyclic compound. The cyclic compound may be readily hydrogenated at the deposition temperatures to form methyl groups. The as-deposited low-κ film may be characterized by an atom (i.e., molecule) percentage of methyl groups (—CH$_3$) relative to silicon oxide (SiO) groups in the low-κ film as measured by the areas of infrared absorption peaks attributed to these groups. In embodiments, the atomic percentage of methyl groups (—CH$_3$) may be greater than 2.5 at %, greater than 2.75 at. %, greater than or about 3 at. %, greater than 3.25 at. %, greater than 3.5 at. %, greater than 3.75 at. %, greater than 4 at. %, or more. Similarly, the atomic percentage of methyl groups may be less than or about 10.0 at. %, less than or about 9.5 at. %, less than or about 9.0 at. %, less than or about 8.5 at. %, less than or about 8.0 at. %, less than or about 7.5 t. %, less than or about 7.0 at. %, or less.

The processing methods of the present technology include embodiments that produce as-deposited low-κ films that are characterized by a high mechanical stability. In embodiments, the as-deposited low-κ films may be characterized by a Young's modulus of greater than or about 3.0 GPa, and may be characterized by a Young's modulus of greater than or about 3.5 GPa, greater than or about 4.0 GPa, greater than or about 4.5 GPa, greater than or about 5.0 GPa, greater than or about 5.5 GPa, greater than or about 6.0 GPa, greater than or about 6.5 GPa, greater than or about 7.0 GPa, greater than or about 7.5 GPa, greater than or about 8.0 GPa, greater than or about 8.5 GPa, or higher. In further embodiments, the as-deposited low-κ films may be characterized by a hardness of greater than or about 0.2 GPa, and may be characterized by a hardness of greater than or about 0.3 GPa, greater than or about 0.4 GPa, greater than or about 0.5 GPa, greater than or about 0.6 GPa, greater than or about 0.7 GPa, or higher. These and other embodiments of the present technology provide a path to forming as-deposited low-κ films from silicon-containing plasma effluents with lower dielectric constants, higher Young's moduli, and higher harnesses that can be produced with conventional plasma deposition methods, and without the need for additional treatment operations such a UV curing.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a material" includes a plurality of such materials, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
flowing one or more deposition precursors to a semiconductor processing system, wherein the one or more deposition precursors include a silicon-containing precursor, wherein the silicon-containing precursor is a cyclic compound;
generating a deposition plasma from the one or more deposition precursors; and
depositing a silicon-and-carbon-containing material on a substrate from plasma effluents of the deposition plasma, wherein the silicon-and-carbon-containing material as-deposited is characterized by a dielectric constant less than or equal to 3.0.

2. The semiconductor processing method of claim 1, wherein the silicon-containing precursor is characterized by Formula 1:

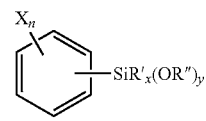

wherein R' is a $C_1$-$C_6$ alkyl group, a $C_1$-$C_6$ allyl group, or hydrogen, wherein x is between 0 and 3;

wherein R" is a $C_1$-$C_6$ alkyl group, wherein y is between 0 and 3; and wherein X is a $C_1$-$C_6$ alkyl group, a $C_1$-$C_6$ allyl group, $NO_2$, $NH_2$, OR', or hydrogen, wherein n is between 0 and 4.

3. The semiconductor processing method of claim 1, wherein the silicon-containing precursor comprises a benzene ring, a cyclopentane ring, or a cyclohexane ring.

4. The semiconductor processing method of claim 1, wherein the deposition precursors further include molecular oxygen ($O_2$), diatomic hydrogen ($H_2$), or a combination of both.

5. The semiconductor processing method of claim 4, wherein generating the deposition plasma from the one or more deposition precursors comprises forming the deposition plasma in a remote plasma unit.

6. The semiconductor processing method of claim 1, wherein the silicon-and-carbon-containing material is characterized by a methyl incorporation greater than or equal to 2.0 at. %.

7. The semiconductor processing method of claim 1, wherein the silicon-and-carbon-containing material is characterized by a Young's modulus of greater than or equal to 3 GPa.

8. The semiconductor processing method of claim 1, wherein the silicon-and-carbon-containing material is characterized by a hardness of greater than or equal to 0.5 GPa.

9. A semiconductor processing method comprising:
flowing deposition precursors to a semiconductor processing system, wherein the deposition precursors include a silicon-containing precursor and a carbon-containing precursor, and wherein the carbon-containing precursor is a cyclic compound;

generating a deposition plasma from the one or more deposition precursors; and depositing a silicon-and-carbon-containing material on a substrate from plasma effluents of the deposition plasma, wherein the silicon-and-carbon-containing material as-deposited is characterized by a dielectric constant less than or equal to 3.0.

10. The semiconductor processing method of claim 9, wherein a temperature is maintained at less than or equal to 420° C. during the generation of the deposition plasma.

11. The semiconductor processing method of claim 9, wherein the deposition precursors further include molecular oxygen ($O_2$).

12. The semiconductor processing method of claim 9, wherein the deposition precursors further include diatomic hydrogen ($H_2$).

13. The semiconductor processing method of claim 9, generating the deposition plasma from the one or more deposition precursors comprises forming the deposition plasma in a remote plasma unit.

14. The semiconductor processing method of claim 9, wherein the silicon-and-carbon-containing material as-deposited is characterized by a Young's modulus of greater than or equal to 5 GPa.

15. A semiconductor processing method comprising:
flowing deposition precursors into a substrate processing region of a semiconductor processing chamber, wherein the deposition precursors include a silicon-containing precursor, and wherein the deposition precursors comprise a cyclic compound;

generating a deposition plasma from the deposition precursors within the substrate processing region; and depositing a silicon-and-carbon-containing material on the substrate from plasma effluents of the deposition plasma, wherein the silicon-and-carbon-containing material as-deposited is characterized by a dielectric constant less than or equal to 3.0, and wherein the silicon-and-carbon-containing material as-deposited is characterized by a Young's modulus of greater than or equal to 4.0 GPa.

16. The semiconductor processing method of claim 15, wherein the silicon-containing precursor comprises the cyclic compound of the deposition precursors.

17. The semiconductor processing method of claim 15, wherein the deposition precursors further include at least one carrier gas comprising helium or nitrogen ($N_2$).

18. The semiconductor processing method of claim 15, wherein generating the deposition plasma comprises applying a RF power of less than or equal to 500 W.

19. The semiconductor processing method of claim 15, wherein a flow rate of the deposition precursors is characterized by less than or equal to 500 mg/min.

20. The semiconductor processing method of claim 15, further comprising performing a post-deposition treatment to the silicon-and-carbon-containing material, wherein the post-deposition treatment comprises a UV cure or a thermal anneal.

* * * * *